United States Patent
Zhang

(10) Patent No.: US 9,515,101 B2
(45) Date of Patent: Dec. 6, 2016

(54) ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventor: Xuehui Zhang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/098,756

(22) Filed: Dec. 6, 2013

(65) Prior Publication Data

US 2014/0159073 A1 Jun. 12, 2014

(30) Foreign Application Priority Data

Dec. 6, 2012 (CN) .......................... 2012 1 0521335

(51) Int. Cl.
| | |
|---|---|
| H01L 29/04 | (2006.01) |
| H01L 29/10 | (2006.01) |
| H01L 31/00 | (2006.01) |
| H01L 27/12 | (2006.01) |
| H01L 29/45 | (2006.01) |

(52) U.S. Cl.
CPC ......... *H01L 27/1259* (2013.01); *H01L 27/124* (2013.01); *H01L 29/458* (2013.01)

(58) Field of Classification Search
USPC .......... 257/E21.413, E27.111, E29.137, 347, 257/88; 438/163, 30, 609
See application file for complete search history.

(56) References Cited

U.S. PATENT DOCUMENTS

| | | | | |
|---|---|---|---|---|
| 6,686,661 | B1 * | 2/2004 | Lee et al. ...................... | 257/741 |
| 6,780,784 | B2 * | 8/2004 | Jo et al. ........................ | 438/745 |
| 6,858,479 | B2 * | 2/2005 | Kim et al. ..................... | 438/158 |
| 6,861,368 | B2 * | 3/2005 | Chae ............................. | 438/738 |
| 6,961,101 | B2 * | 11/2005 | Hwang et al. ................. | 349/43 |
| 7,052,993 | B2 * | 5/2006 | Lee et al. ...................... | 438/687 |
| 7,229,569 | B1 * | 6/2007 | Seki et al. ..................... | 252/79.1 |
| 7,696,088 | B2 | 4/2010 | Long et al. | |
| 8,603,914 | B2 * | 12/2013 | Song ............................ | 438/670 |
| 2004/0126914 | A1 * | 7/2004 | Chang et al. .................. | 438/30 |
| 2011/0147753 | A1 * | 6/2011 | Onishi ..................... | C22C 9/00 257/59 |

FOREIGN PATENT DOCUMENTS

| | | |
|---|---|---|
| CN | 1776513 | 5/2006 |
| CN | 1841758 | 10/2006 |
| CN | 1897269 | 1/2007 |
| CN | 101110434 A | 1/2008 |

OTHER PUBLICATIONS

P.R. China, First Office Action, App. No. 201210521335.9, Oct. 17, 2014.
P.R. China, Second Office Action, App. No. 201210521335.9, May 11, 2015.
Office Action in Chinese Patent Application No. 201210521335.9, dated Oct. 26, 2015.
Office Action in Chinese Patent Application No. 201210521335.9, dated Sep. 1, 2016.

* cited by examiner

*Primary Examiner* — Telly Green
(74) *Attorney, Agent, or Firm* — Bakerhostetler LLP

(57) ABSTRACT

The present invention provides an array substrate and a method for manufacturing the same, and a display device. Wherein, after forming a pattern corresponding to a source/drain electrode layer, a transparent conducting layer is formed, and then a passivation layer is formed on the transparent conducting layer. Because the transparent conducting layer has a characteristic of anti-etching, it is hard to be damaged, so that the problem of damage of copper in the source/drain electrode layer is solved without increasing the process steps for forming the array substrate.

14 Claims, 5 Drawing Sheets

ARRAY SUBSTRATE AND METHOD FOR MANUFACTURING THE SAME, AND DISPLAY DEVICE

PRIORITY

The present application claims priority to and incorporates by reference the entire contents of Chinese priority document 201210521335.9, filed in China on Dec. 6, 2012.

BACKGROUND OF THE INVENTION

Field of the Invention

The present invention relates to the field of display technologies, particularly, to an array substrate and a method for manufacturing the same, and a display device.

Description of the Prior Art

Due to the characteristics of small volume, low power consumption and no radiation, etc., thin film transistor-liquid crystal display (TFT-LCD) takes the leading position in the current market of flat panel displays. For TFT-LCD, the product performance, yield and price thereof are determined by its array substrate and manufacturing process.

With the development of liquid crystal panels toward the direction of large scale, high refinement, high frequency and 3D, etc., electrode materials with low resistance need to be developed in the industry. Because the resistance of the electrode materials decreases, the resistance and captance (RC) delay is lowered, and the aperture ratio is raised. Moreover, the driving mode may be changed from two-side driving to single-side driving, thus the number of driving ICs may be halved.

Because the resistance of metal copper is only 2 μΩ·cm, it has become a preferred electrode material at present.

However, when copper is taken as the electrode material, there exist the following problem:

The upper surface of the copper is prone to be damaged during the depositing and etching process of a pattern thin film covering thereon, which causes the undercharging of a pixel region and the bad connection between a pin (Pad) region and an external circuit.

SUMMARY OF THE INVENTION

The invention provides an array substrate and a method for manufacturing the same, and a display device, so that the problem of damage of the copper in the source/drain electrode layer may be solved, without increasing the process steps.

The invention provides the following solutions:

One embodiment of the invention provides an array substrate, comprising a thin film transistor (TFT) and a pixel electrode connected with a drain electrode of the TFT, wherein, the array substrate further comprises:

a transparent conducting layer formed on a source/drain electrode layer; and a passivation layer formed on the transparent conducting layer.

Preferably, the transparent conducting layer and the pixel electrode are formed in the same layer.

Preferably, the source/drain electrode layer comprises:

a first buffer layer, and a copper layer formed on the first buffer layer.

Preferably, the buffer layer at least comprises a layer of metal or alloy, or a transparent conducting thin film.

Preferably, a via hole is set in the passivation layer.

Preferably, the array substrate further comprises a gate pattern which comprises:

a second buffer layer; and a copper layer formed on the second buffer layer.

One embodiment of the invention further provides a method for manufacturing an array substrate, which comprises:

forming a pattern corresponding to a source/drain electrode layer;

forming a pattern corresponding to a transparent conducting layer on the source/drain electrode layer; and forming a pattern corresponding to a passivation layer on the transparent conducting layer.

Preferably, a pattern corresponding to a transparent conducting layer and a pattern of a pixel electrode are formed on the source/drain electrode layer.

Preferably, forming the pattern corresponding to a source/drain electrode layer comprises:

forming a pattern of a buffer layer; and depositing a layer of copper on the buffer layer, wherein the buffer layer and the copper layer construct the source/drain electrode layer.

Preferably, the buffer layer at least comprises a layer of metal or alloy, or a transparent conducting thin film.

Preferably, the method further comprises:

forming a via hole at a preset position in the passivation layer.

One embodiment of the invention further provides a display device, which comprises the display panel provided in the above embodiments of the invention.

It may be seen from the above description that, in the array substrate and the method for manufacturing the same, and the display device provided in the embodiments of the invention, after the forming process of a source/drain electrode layer, a transparent conducting layer is first formed, and then a passivation layer and a via hole set optionally as required are prepared on the transparent conducting layer, and because the transparent conducting layer has a characteristic of anti-etching, it is hard to be damaged, so that the problem of damage of the copper in the source/drain electrode layer may be solved, without increasing the steps in the process for forming the array substrate.

As used herein, the term "a gate pattern" includes but not limited a pattern for forming a gate electrode, further include patterns for forming a gate lead, a common electrode etc.

As used herein, the term "a pattern corresponding to a gate electrode" includes but not limited a pattern for forming a gate electrode, further include patterns for forming a gate lead, a common electrode etc.

As used herein, the term "a pattern corresponding to a source/drain electrode layer" includes but not limited a pattern for forming a source/drain electrode layer, further include patterns for forming a common electrode etc.

As used herein, the term "a pattern corresponding to a transparent conducting layer" includes but not limited a pattern for forming transparent conducting layer, further include patterns for forming a common electrode etc.

As used herein, the term "a pattern of a pixel electrode" includes but not limited a pattern for forming a pixel electrode, further include patterns for forming a common electrode etc.

DETAILED DESCRIPTION OF THE PREFERRED EMBODIMENTS

Figure 1:
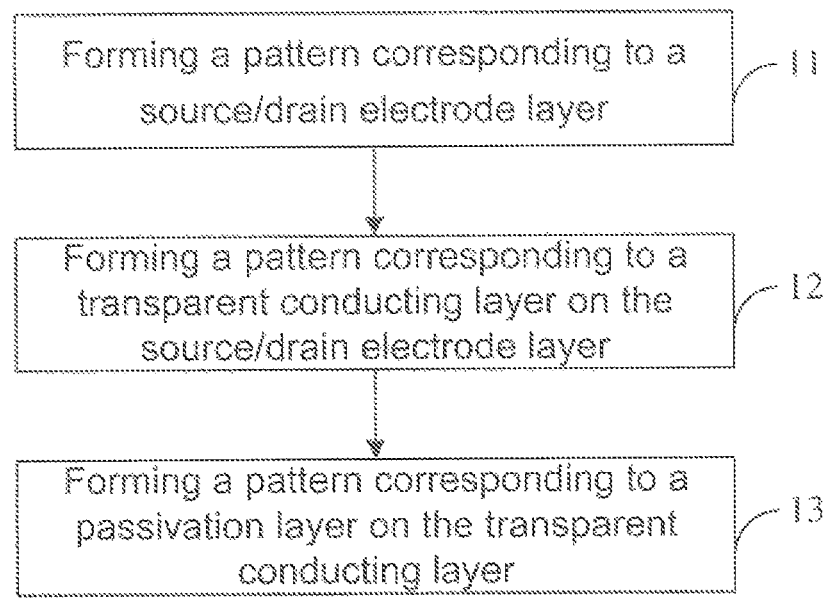
FIG. 1 is a schematic flow chart of a method for manufacturing an array substrate according to one embodiment of the invention.

One embodiment of the invention provides an array substrate, which specifically may comprise a TFT structure and a pixel electrode connected with a drain electrode of the TFT.

Moreover, the array substrate specifically may further comprises:

a transparent conducting layer 7 formed on a source/drain electrode layer; and a passivation layer 8 formed on the transparent conducting layer 7.

In the array substrate according to the embodiment of the invention, after the process for forming a source/drain electrode layer, a transparent conducting layer 7 is first formed, and then a passivation layer 8 is prepared on the transparent conducting layer 7, because the transparent conducting layer 7 has a characteristic of anti-etching, it is hard to be damaged, so that the problem of damage of the copper in the source/drain electrode layer may be solved, without increasing the steps in the process for forming the array substrate.

In the embodiment of the invention, specifically, the transparent conducting layer 7 and the pixel electrode 10 are preferably formed in the same layer.

Specifically, the source/drain electrode layer concerned in the embodiment of the invention may be jointly constructed by a buffer layer (BUFFER) 61 and a copper layer 62 formed on the buffer layer.

Moreover, the buffer layer may specifically comprise at least one layer of metal such as Ta, Cr, Mo, W and Nb, etc., or alloy, or a transparent conducting thin film.

That is, specifically, the source/drain electrode layer according to the embodiment of the invention may be constructed by a multi-layer pattern layer structure.

Certainly, it may be understood that, the source/drain electrode layer concerned in the embodiment of the invention may also be completely constructed by a copper layer.

In the embodiment of the invention, specifically, a via hole may be set in the passivation layer 8.

Similarly, because a transparent conducting layer 7, which is hard to be damaged, is formed between the passivation layer 8 and the source/drain electrode layer, the surface of copper will not be damaged during the etching process of the via hole.

The array substrate according to the embodiment of the invention may specifically comprise:

a transparent substrate 1; and a gate, a gate insulating layer 3, a semiconductor layer 4 and an ohmic contact layer 5 formed in turn between the transparent substrate 1 and the source/drain electrode layer.

However, in one preferred embodiment, the gate concerned in the embodiment of the invention may also be jointly constructed by a buffer layer (BUFFER) 21 and a copper layer 22 formed on the buffer layer.

Moreover, the material constructing the buffer layer 21 of the gate metal layer may specifically be the same as that constructing the buffer layer 61 of the source/drain electrode layer.

Specifically, the gate concerned in the embodiment of the invention may be jointly formed with a gate metal layer pattern including a gate line and a gate lead, etc.

In the array substrate according to the embodiment of the invention, a separate area is formed in the source/drain electrode layer and the transparent conducting layer 7.

Figure 5:
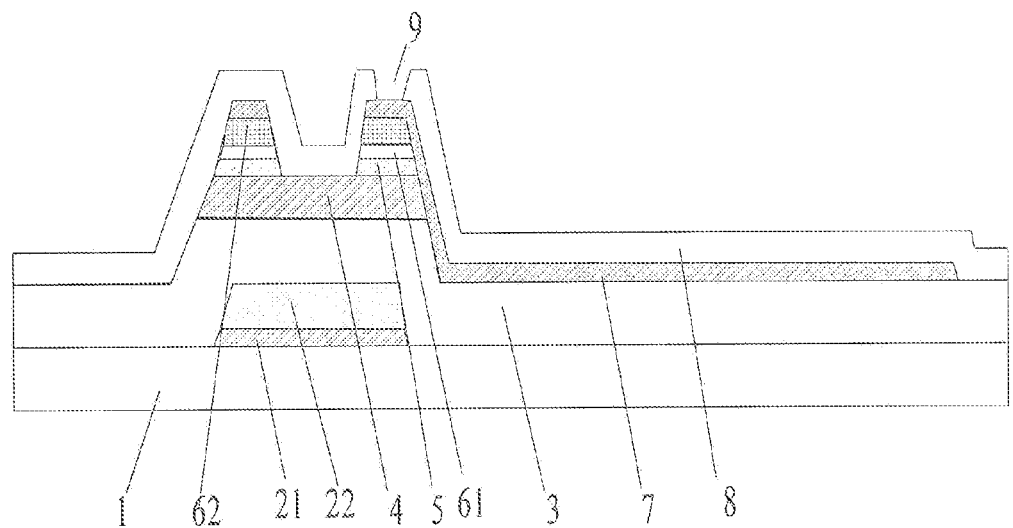
FIG. 5 is structural representation 4 of the array substrate according to the embodiment of the invention.
Figure 9:
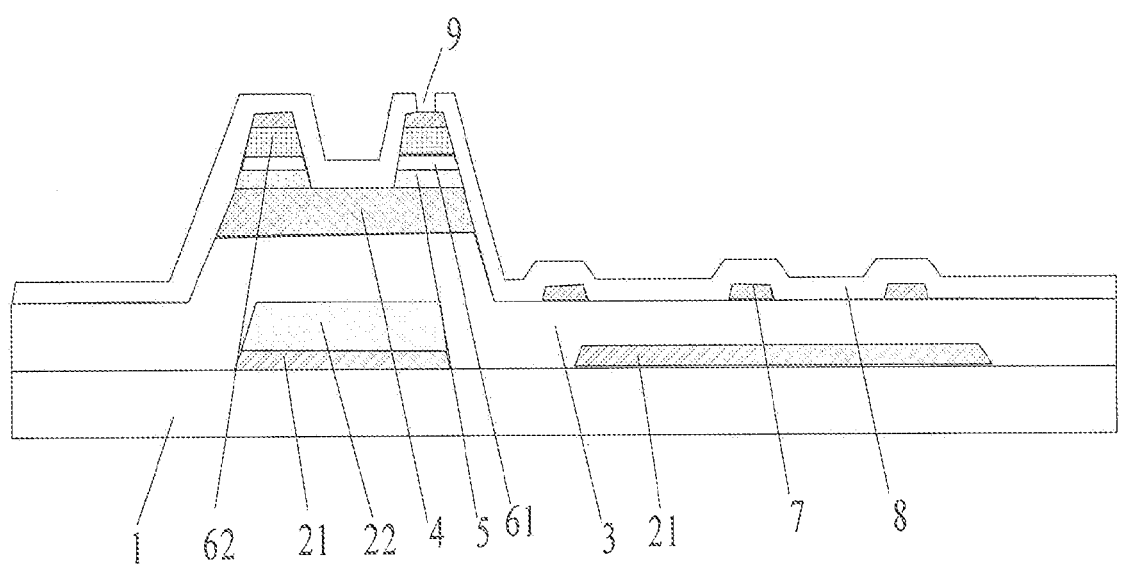
FIG. 9 is structural representation 8 of the array substrate according to the embodiment of the invention.

Specifically, the array substrate according to the embodiment of the invention may be as shown in FIG. 5 or 9.

In order to manufacture the array substrate according to the embodiment of the invention, one embodiment of the invention further provides a method for manufacturing an array substrate, as shown in FIG. 1, which may specifically comprise:

Step 11: forming a pattern corresponding to a source/drain electrode layer;

Step 12: forming a pattern corresponding to a transparent conducting layer 7 on the source/drain electrode layer; and Step 13: forming a pattern corresponding to a passivation layer 8 on the transparent conducting layer 7.

It may be known from the above statement that, in the embodiment of the invention, the source/drain electrode layer may specifically be jointly constructed by a buffer layer 61 and a copper layer 62, thus the process of forming a pattern corresponding to a source/drain electrode layer on existing pattern layers of the array substrate may specifically comprise:

forming a pattern of the buffer layer 61 included in the source/drain electrode layer; and depositing a layer of copper on the pattern of the buffer layer 61, wherein the buffer layer 61 and the copper layer 62 construct the source/drain electrode layer.

In the embodiment of the invention, the process of forming a pattern corresponding to a source/drain electrode layer may specifically comprise:

coating a layer of photoresist on the source/drain electrode layer thin film (including the buffer layer 61 and the copper layer 62);

exposing and developing, so as to make the array substrate at the position of the pattern corresponding to a source/drain electrode layer a completely reserved photoresist region and make other regions of the array substrate a no-photoresist region;

etching off the source/drain electrode layer thin film in the no-photoresist region by etching process; and removing the remaining photoresist, so as to form a pattern layer corresponding to the source/drain electrode layer.

In the embodiment of the invention, the pattern corresponding to a source/drain electrode layer may specifically comprise a source electrode, a drain electrode, a data scanning line, a TFT separate area, a source lead, a drain lead and a gate lead, etc.

In the method according to the embodiment of the invention, it specifically may further comprise: forming a via hole at a preset position in the passivation layer 8.

That is, in the embodiment of the invention, via holes are formed in the passivation layer 8, and because a transparent conducting layer 7, which is hard to be damaged, is formed between the passivation layer 8 and the source/drain electrode layer, the surface of copper will not be damaged during etching via holes.

Additionally, the method according to the embodiment of the invention specifically may further comprise:

forming a pattern corresponding to a gate electrode, a gate insulating layer 3, a semiconductor layer 4 and an ohmic contact layer 5 between the transparent substrate 1 and the source/drain electrode layer.

Moreover, the process for forming the gate electrode is similar to the process for forming the source/drain electrode layer, that is, the buffer layer 21 included in the gate metal layer may be formed on the substrate 1 first, and then a layer of copper 22 may be deposited on the buffer layer 21, wherein the buffer layer 21 and the copper layer 22 construct the gate electrode.

In the method for manufacturing an array substrate according to the embodiment of the invention, mature methods may be employed to prepare each pattern layer; that is, in the method for manufacturing an array substrate according to the embodiment of the invention, it may not need to modify the existing manufacturing process, so that the problem of damage of the copper in the source/drain electrode layer may be solved, without increasing any manufacturing cost.

It will be illustrated by taking the formation of a pattern corresponding to the ohmic contact layer 5 as an example.

The process for forming the pattern corresponding to the ohmic contact layer 5 may specifically comprise:

depositing a thin film of an ohmic contact layer 5 on existing pattern layers of the substrate;

coating a layer of photoresist on the thin film of the ohmic contact layer 5;

carrying out exposing and developing treatment on the photoresist coated, so as to make the position at which the pattern of the ohmic contact layer 5 exists a completely reserved photoresist region and make other regions of the array substrate a no-photoresist region;

etching off the thin film of the ohmic contact layer 5 in the no-photoresist region by an etching process; and removing the remaining photoresist, and forming a pattern corresponding to the ohmic contact layer 5.

Additionally, in the method for manufacturing an array substrate according to the embodiment of the invention, a plurality of pattern layers of the array substrate may also be prepared in one-time MASK process.

The implementation process of one specific embodiment of the method for manufacturing an array substrate according to one embodiment of the invention will be described in detail below.

This embodiment may specifically comprise the following steps:

Step 1: forming a pattern corresponding to a gate electrode.

This step may specifically comprise:

First of all, a layer of thin film of a buffer layer 21 is deposited on substrate 1 by sputtering or heat evaporation, etc.

In the embodiment of the invention, specifically, the film-forming method may also be plasma-enhanced chemical vapor deposition (PECVD), magnetron sputtering, heat evaporation or other film-forming methods.

In the embodiment of the invention, the thickness of the thin film of the buffer layer 21 is about 100~1000 Å, and the material of the thin film of the buffer layer 21 may include metal such as Ta, Cr, Mo, W and Nb, etc., or alloy, or a transparent conducting thin film.

Then, a thin film of a copper layer 22 is deposited on the thin film of the buffer layer 21.

In the embodiment of the invention, the thickness of the thin film of the copper layer 22 is about 1000~5000 Å.

Therefore, a gate thin film consisted of multi-layer pattern layer structure may be formed.

A pattern layer corresponding to a gate is formed by a first photoetching process.

It may be understood that, in this step, a pattern corresponding to the gate metal layer, for example, gate electrode and gate lead, etc., may be formed simultaneously.

The first photoetching process may specifically comprise:

coating a layer of photoresist on the gate thin film;

carrying out exposing and developing treatment on the photoresist coated, so as to make the position at which the pattern corresponding to a gate exists a completely reserved photoresist region and make other regions of the array substrate a no-photoresist region;

etching off the gate thin film in the no-photoresist region by a wet-etching process; and removing the remaining photoresist, and forming a pattern corresponding to a gate electrode.

Figure 2:
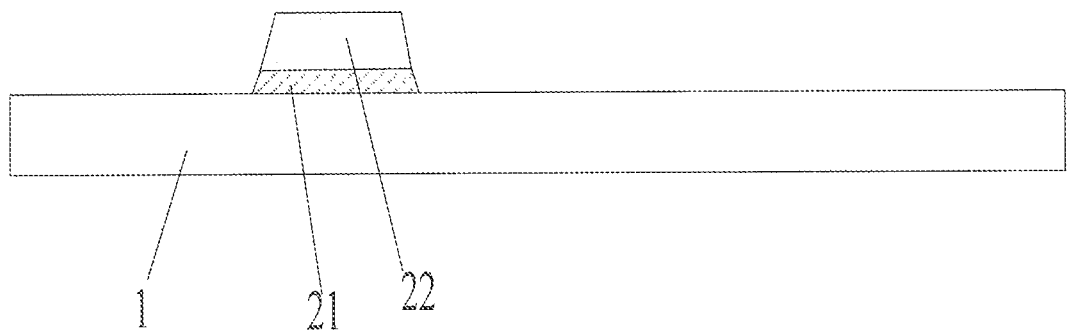
FIG. 2 is structural representation 1 of an array substrate according to one embodiment of the invention.

At this point, the structural representation of the array substrate according to the embodiment of the invention may be specifically as shown in FIG. 2.

Step 2: forming patterns corresponding to a gate insulating layer 3, a semiconductor layer 4, an ohmic contact layer 5 and a source/drain electrode layer.

This step may specifically comprise:

forming thin films of the gate insulating layer 3, the semiconductor layer 4 and the ohmic contact layer 5 on the substrate on which Step 1 has been completed, by PECVD, etc.

Wherein, the thickness of the thin film of the gate insulating layer 3 may specifically be 1000~4000 Å, and the material of the thin film of the gate insulating layer 3 may specifically include nitride SiNx or oxygen-nitrogen compound SiOxNx, or a composite of nitride SiNx and oxygen-nitrogen compound SiOxNx, etc.

While the thickness of the thin film of the semiconductor layer 4 may specifically be 1000~3000 Å.

The thickness of thin film of the ohmic contact layer 5 may specifically be 500~1000 Å.

Next, metal such as Ta, Cr, Mo, W and Nb, etc., or alloy, or a transparent conducting thin film with a thickness of about 100~1000 Å is deposited in turn by sputtering or heat evaporation as the buffer layer 61, and then a copper layer 62 with a thickness of about 1000~5000 Å is deposited, and the source/drain electrode layer is consisted of multi-layer pattern layer structure.

Subsequently, patterns corresponding to a gate insulating layer 3, a semiconductor layer 4, an ohmic contact layer 5 and a source/drain electrode layer, for example, a TFT separate area, a source electrode, a drain electrode and a data scanning line, are formed after a multi-step etching by a half tone mask or gray tone mask exposing and developing process.

Any mature mode may be employed to implement the above exposing, developing and etching processes.

Figure 3:
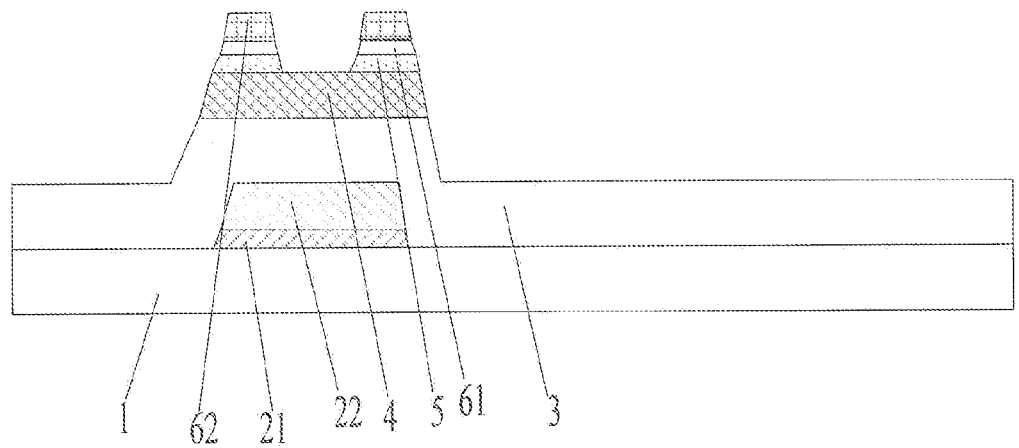
FIG. 3 is structural representation 2 of the array substrate according to the embodiment of the invention.

At this point, the structural representation of the array substrate according to the embodiment of the invention may be specifically as shown in FIG. 3.

Step 3: forming a pattern corresponding to a transparent conducting layer 7.

Specifically, a layer of transparent conducting layer 7 with a thickness of about 300~1000 Å may be deposited on the array substrate on which Step 2 has been completed, by sputtering or heat evaporation, etc.

The material of the transparent conducting layer 7 may specifically include ITO, or IZO, or other metals and metal oxides.

A pattern corresponding to the transparent conducting layer 7 is formed by a one-time photoetching and an etching process.

The pattern corresponding to the transparent conducting layer 7 may specifically include the transparent conducting electrode in the TFT and the transparent pixel electrode in the display region.

Figure 4:
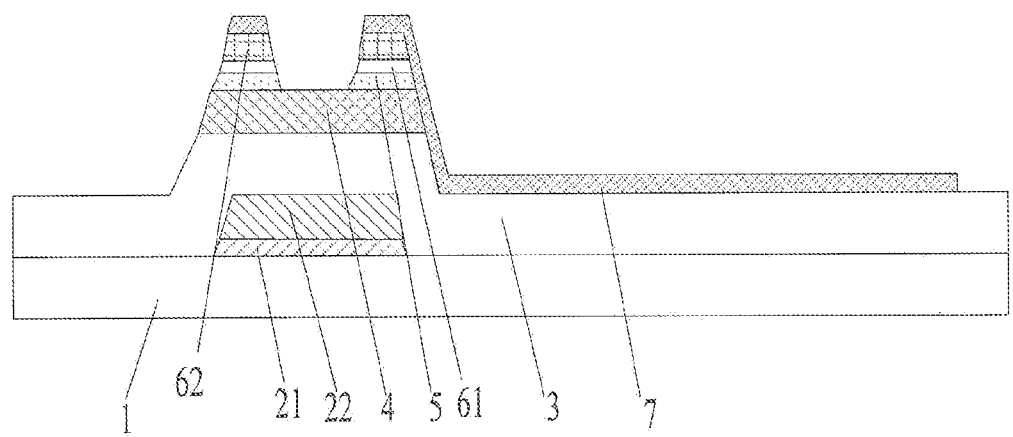
FIG. 4 is structural representation 3 of the array substrate according to the embodiment of the invention.

At this point, the structural representation of the array substrate according to the embodiment of the invention may be specifically as shown in FIG. 4.

Step 4: forming a pattern corresponding to a passivation layer 8.

Of course, in step 4, a via hole may formed as required in the passivation layer 8.

Specifically, a passivation layer 8 with a thickness of about 700~5000 Å may be deposited on the array substrate on which Step 3 has been completed, by PECVD, etc., and a via hole may be formed as required in the passivation layer 8.

In the embodiment of the invention, the material of the passivation layer 8 may specifically include an oxide, a nitride or an oxygen-nitrogen compound, etc.

At this point, the structural representation of the array substrate according to the embodiment of the invention may be specifically as shown in FIG. 5.

In another specific embodiment, the method for manufacturing an array substrate according to the embodiment of the invention may also be used for manufacturing an ADS-type array substrate.

The specific implementation process of this embodiment may specifically comprise:

Step 1: forming patterns corresponding to a gate electrode and a common electrode.

Here, it should be noted that, the common electrode in an ADS-type array substrate lies in the display region, thus in this embodiment, the gate metal layer at the position of the common electrode may only comprise a layer of buffer layer 21 (that is, no copper 22 needs to be deposited), and the material of the buffer layer 21 may specifically be a transparent conducting thin film.

While the pattern corresponding to the gate may be jointly constructed by a buffer layer 21 and a copper layer 22.

This step may specifically comprise:

First of all, a layer of thin film of a buffer layer 21 is deposited on substrate 1 via sputtering or heat evaporation, etc.

In the embodiment of the invention, the thickness of the thin film of the buffer layer 21 is about 100~1000 Å, and the material of the thin film of the buffer layer 21 may include metal such as Ta, Cr, Mo, W and Nb, etc., or alloy, or a transparent conducting thin film.

Then, a thin film of a copper layer 22 is deposited on the thin film of the buffer layer 21 at the position of the gate pattern.

In the embodiment of the invention, the thickness of the thin film of the copper layer 22 is about 1000~5000 Å.

A pattern layer corresponding to a gate is formed by a first photoetching process.

The procedure of the first photoetching process may specifically comprise:

coating a layer of photoresist on the thin film of the gate electrode and the common electrode;

carrying out exposing and developing treatment on the photoresist coated, so as to make the position at which patterns corresponding to the gate electrode and the common electrode exist a completely reserved photoresist region and make other regions of the array substrate a no-photoresist region; and etching off the thin film in the no-photoresist region by a wet-etching process;

removing the remaining photoresist, and forming patterns corresponding to a gate electrode and a common electrode.

Figure 6:
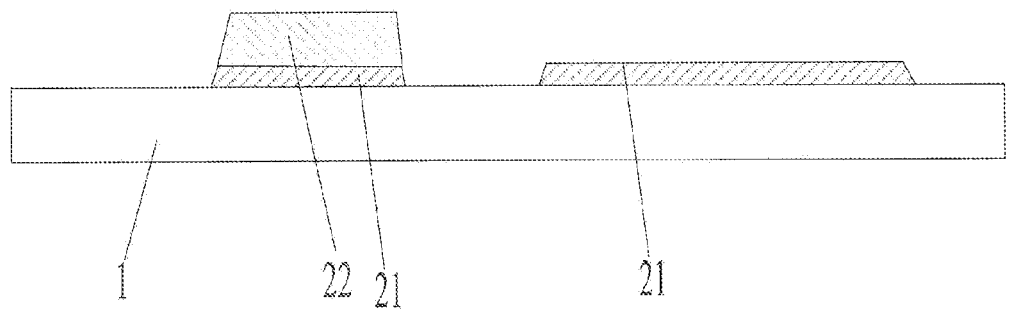
FIG. 6 is structural representation 5 of the array substrate according to the embodiment of the invention.

At this point, the structural representation of the array substrate according to the embodiment of the invention may be specifically as shown in FIG. 6.

Step 2: forming patterns corresponding to a gate insulating layer 3, a semiconductor layer 4, an ohmic contact layer 5 and a source/drain electrode layer.

This step may specifically comprise:

forming thin films of the gate insulating layer 3, the semiconductor layer 4 and the ohmic contact layer 5 on the substrate on which Step 1 is completed, by PECVD, etc.

Wherein, the thickness of the thin film of the gate insulating layer 3 may specifically be 1000~4000 Å, and the material of the thin film of the gate insulating layer 3 may specifically include nitride SiNx or oxygen-nitrogen compound SiOxNx, or a composite of nitride SiNx and oxygen-nitrogen compound SiOxNx, etc.

While the thickness of the thin film of the semiconductor layer 4 may specifically be 1000~3000 Å.

The thickness of thin film of the ohmic contact layer 5 may specifically be 500~1000 Å.

Next, metal such as Ta, Cr, Mo, W and Nb, etc., or alloy, or a transparent conducting thin film with a thickness of about 100~1000 Å is deposited in turn by sputtering or heat evaporation as the buffer layer 61, and then a copper layer 62 with a thickness of about 1000~5000 Å is deposited, and the source/drain electrode layer is consisted of multi-layer pattern layer structure.

Subsequently, patterns corresponding to a gate insulating layer 3, a semiconductor layer 4, an ohmic contact layer 5 and a source/drain electrode layer, for example, a TFT separate area, a source electrode, a drain electrode and a data scanning line, are formed after a multi-step etching, via a halft one mask or gray tone mask exposing and developing process.

Any mature mode may be employed to implement the above exposing, developing and etching processes.

Figure 7:
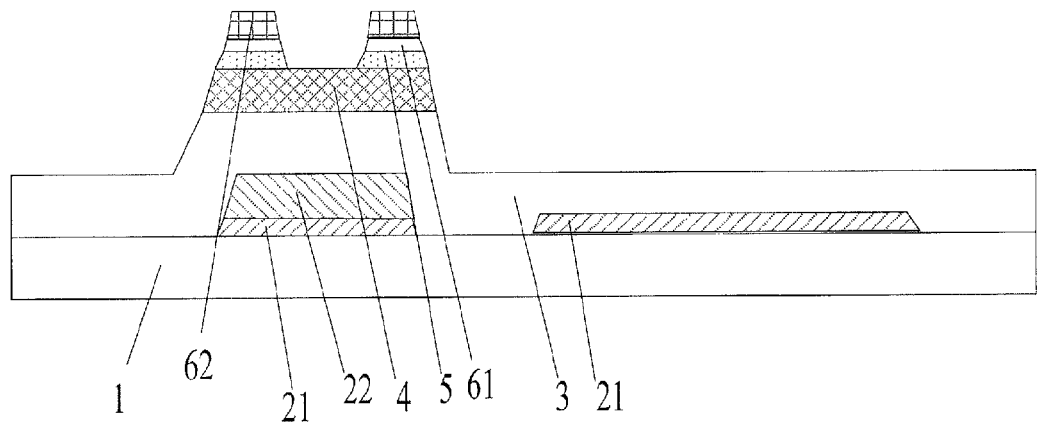
FIG. 7 is structural representation 6 of the array substrate according to the embodiment of the invention.

At this point, the structural representation of the array substrate according to the embodiment of the invention may be specifically as shown in FIG. 7.

Step 3: forming a pattern corresponding to a transparent conducting layer 7.

Specifically, a layer of transparent conducting layer 7 with a thickness of about 300~1000 Å may be deposited on the array substrate on which Step 2 has been completed, by sputtering or heat evaporation, etc.

The material of the transparent conducting layer 7 may specifically include ITO, or IZO, or other metals and metal oxides.

A pattern corresponding to the transparent conducting layer 7 is formed by a one-time photoetching and an etching process.

The pattern corresponding to the transparent conducting layer 7 concerned in this embodiment may specifically comprise the transparent conducting electrode in the TFT and the transparent pixel electrode in the display region.

Figure 8:
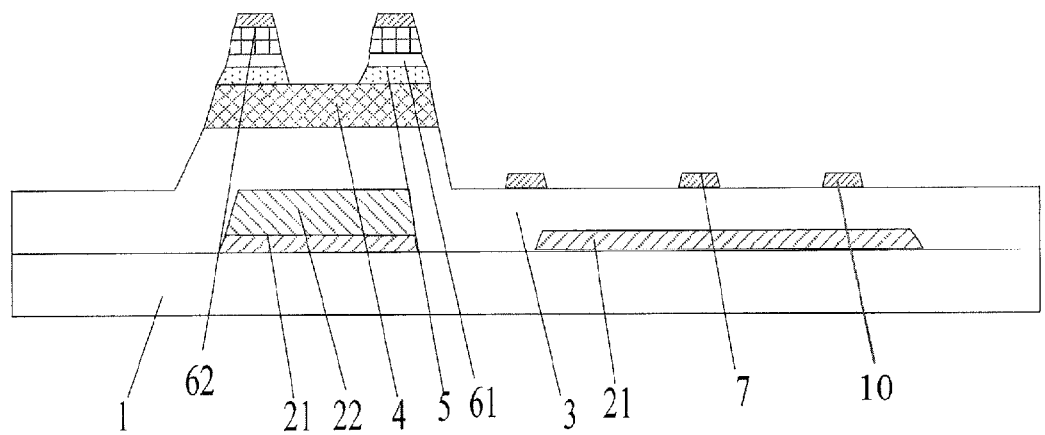
FIG. 8 is structural representation 7 of the array substrate according to the embodiment of the invention.

At this point, the structural representation of the array substrate according to the embodiment of the invention may be specifically as shown in FIG. 8.

Step 4: forming a pattern corresponding to a passivation layer 8.

Of course, in step 4, a via hole may be formed in the passivation layer 8

Specifically, a passivation layer 8 with a thickness of about 700~5000 Å may be deposited on the array substrate on which Step 3 has been completed, by PECVD, etc., and a via hole may be formed as required in the passivation layer 8.

For example, as shown in FIG. 9, the pattern corresponding to the transparent conducting layer 7 according to the embodiment of the invention may be specifically may comprise transparent conducting electrode in TFT and the second electrode in display region; that is, the transparent conducting layer in display region and the transparent conducting layer in TFT are disconnected here.

In the embodiment of the invention, the material of the passivation layer 8 may specifically include an oxide, a nitride or an oxygen-nitrogen compound, etc.

At this point, the structural representation of the array substrate according to the embodiment of the invention may be specifically as shown in FIG. 9.

Based on the array substrate manufactured by the method for manufacturing an array substrate provided in the above embodiments of the invention, it only needs to guarantee that, after the forming process of a source/drain electrode layer, a transparent conducting layer 7 is first formed, and then a passivation layer 8 and a via hole set as required are prepared on the transparent conducting layer 7; because the transparent conducting layer 7 has a characteristic of anti-etching, it is hard to be damaged, so that the problem of damage of the copper in the source/drain electrode layer may be solved, without increasing the steps in the process for forming the array substrate. The array substrate may also have other structural modifications, so long as it can guarantee that the metal layers are insulating from each other and have a conducting part (for example, a connecting electrode manufactured by an ITO material) that is connected to the outside.

Based on the above array substrate according to the embodiments of the invention, one embodiment of the invention may further provide a display device, which may specifically comprise the array substrate or the display panel according to the embodiments of the invention. The display device may be a product or a part having a display function, for example, liquid crystal panel, electronic paper, OLED (organic light-emitting diode) panel, liquid crystal TV, liquid crystal display, digital photo frame, mobile phone and flat panel computer, etc.

In the array substrate and the method for manufacturing the same, and the display device provided in the embodiments of the invention, after the forming process of a source/drain electrode layer, a transparent conducting layer is first formed, and then a passivation layer and a via hole set as required are prepared on the transparent conducting layer, and because the transparent conducting layer has a characteristic of anti-etching, it is hard to be damaged, so that the problem of damage of the copper in the source/drain electrode layer may be solved, without increasing the steps in the process for forming the array substrate.

The above description only shows some embodiments of the invention, and it should be pointed out that, for one of ordinary skills in the art, many improvements and modifications can be made without departing from the principle of the invention, and all these improvements and modifications fall into the protection scope of the invention.

What is claimed is:

1. An array substrate, comprising a TFT, a pixel electrode and a transparent conducting layer connected with a drain electrode of the TFT having a source/drain electrode layer with an upper side surface, wherein, the array substrate further comprises:
   the transparent conducting layer formed directly upon the upper side surface of the source/drain electrode layer and in physical contact with the source/drain electrode layer; and
   a passivation layer formed directly upon the transparent conducting layer and in physical contact with the transparent conducting layer such that the transparent conducting layer lies between the passivation layer on one side thereof and the upper side surface of the source/drain electrode layer on the opposite side thereof, and
   wherein the transparent conducting layer and the pixel electrode are formed from a same layer.

2. The array substrate according to claim 1, wherein the source/drain electrode layer comprises:
   a first buffer layer;
   a copper layer formed on the first buffer layer.

3. The array substrate according to claim 2, wherein the first buffer layer at least comprises a layer of metal or alloy, or a transparent conducting thin film.

4. The array substrate according to claim 1, wherein via holes are set in the passivation layer.

5. The array substrate according to claim 1, further comprising a gate pattern, which comprises:
   a second buffer layer; and
   a copper layer formed on the second buffer layer.

6. A method for manufacturing an array substrate, comprising:
   forming a pattern corresponding to a source/drain electrode layer having an upper side surface;
   forming a pattern corresponding to a transparent conducting layer directly upon the upper side surface of the source/drain electrode layer and in physical contact with the source/drain electrode layer; and
   forming a pattern corresponding to a passivation layer directly upon the transparent conducting layer and in physical contact with the transparent conducting layer such that the transparent conducting layer lies between the passivation layer on one side thereof and the upper side surface of the source/drain electrode layer on the opposite side thereof, and wherein the pattern corresponding to the transparent conducting layer and a pattern corresponding to the pixel electrode are from the same layer.

7. The method according to claim 6, wherein, forming the pattern corresponding to a source/drain electrode layer comprises:
   forming a pattern of a buffer layer; and
   depositing a layer of copper on the buffer layer, wherein the buffer layer and the copper layer construct the source/drain electrode layer.

8. The method according to claim 7, wherein, the buffer layer at least comprises a layer of metal or alloy, or a transparent conducting thin film.

9. The method according to claim 6, wherein, the method further comprises:
   forming a via hole at a preset position in the passivation layer.

10. A display device, wherein the display device comprises the array substrate of claim 1.

11. The display device according to claim 10, wherein the source/drain electrode layer comprises:
   a first buffer layer;
   a copper layer formed on the first buffer layer.

12. The display device according to claim 9, wherein the first buffer layer at least comprises a layer of metal or alloy, or a transparent conducting thin film.

13. The display device according to claim 8, wherein via holes are set in the passivation layer.

14. The display device according to claim 8, further comprising a gate pattern, which comprises:
   a second buffer layer; and
   a copper layer formed on the second buffer layer.

* * * * *